(12) United States Patent
Lisart et al.

(10) Patent No.: US 8,796,765 B2
(45) Date of Patent: Aug. 5, 2014

(54) DEVICE FOR PROTECTING AN INTEGRATED CIRCUIT CHIP AGAINST ATTACKS

(75) Inventors: Mathieu Lisart, Aix en Provence (FR);
Alexandre Sarafianos, Marseilles (FR);
Olivier Gagliano, Marseilles (FR);
Marc Mantelli, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/495,945

(22) Filed: Jun. 13, 2012

(65) Prior Publication Data
US 2012/0320480 A1 Dec. 20, 2012

(30) Foreign Application Priority Data
Jun. 17, 2011 (FR) ...................................... 11 55343

(51) Int. Cl.
*H01L 29/66* (2006.01)
(52) U.S. Cl.
USPC .......................................... 257/334; 438/510
(58) Field of Classification Search
USPC ............ 257/E21.632, 48, 334; 438/200, 510, 438/527
See application file for complete search history.

(56) References Cited

U.S. PATENT DOCUMENTS

| | | | |
|---|---|---|---|
| 4,862,240 A * | 8/1989 | Watanabe et al. ............. | 257/370 |
| 6,010,939 A | 1/2000 | Bothra | |
| 2005/0276127 A1 | 12/2005 | Takeuchi | |
| 2006/0180939 A1 | 8/2006 | Matsuno | |
| 2009/0251168 A1* | 10/2009 | Lisart et al. ........................ | 326/8 |
| 2010/0187525 A1 | 7/2010 | Bartley et al. | |
| 2011/0012195 A1* | 1/2011 | Momota et al. ................ | 257/334 |
| 2011/0169560 A1* | 7/2011 | Ito .................................. | 327/537 |
| 2013/0154023 A1* | 6/2013 | Yoshida et al. ................ | 257/369 |

OTHER PUBLICATIONS

Mathieu Lisart et al., "Device for Detecting an Attack in an Integrated Circuit Chip," Office Action mailed May 28, 2014 for U.S. Appl. No. 13/523,599, 22 pages.

* cited by examiner

*Primary Examiner* — Jarrett Stark
*Assistant Examiner* — Shahed Ahmed
(74) *Attorney, Agent, or Firm* — Seed IP Law Group PLLC

(57) ABSTRACT

An integrated circuit chip includes: a plurality of parallel wells of alternated conductivity types formed in the upper portion of a semiconductor substrate of a first conductivity type; in each well of the first type, a plurality of MOS transistors having a channel of the second conductivity type, and in each well of the second type, a plurality of MOS transistors having a channel of the first type, transistors of neighboring wells being inverted-connected; and a device of protection against attacks, including: a layer of the second type extending under said plurality of wells, from the lower surface of said wells; and regions of lateral insulation between the wells, said regions extending from the upper surface of the wells to said layer.

26 Claims, 3 Drawing Sheets

DEVICE FOR PROTECTING AN INTEGRATED CIRCUIT CHIP AGAINST ATTACKS

BACKGROUND

1. Technical Field

The present disclosure relates to the protection of an integrated circuit chip against attacks aiming at obtaining protected confidential data.

2. Description of Related Art

In some secure devices such as payment cards, integrated circuits chips are likely to process and/or store critical data, for example, encryption keys. Such chips may be fraudulently manipulated to obtain protected confidential data.

Among known attacks, so-called "fault injection attacks" comprise intentionally disturbing the chip operation and analyzing the influence of the disturbances on its behavior. The attacker especially examines the influence of the disturbances on data such as output signals, the consumption, or response times. He is likely to infer from it, by statistic studies or the like, critical data such as algorithms implemented by the chip, and possibly encryption keys.

To intentionally cause anomalies in the circuits of a chip, an attack mode comprises bombarding chip areas with a laser beam while the chip is operating. Faults can thus be injected into certain memory cells and/or affect the behavior of certain components. Due to the presence of interconnection metal tracks on the front surface side of the substrate, laser attacks are often carried out on the rear surface of the chip. The attacker may provide a preliminary step of thinning of the chip substrate, which enables to minimize the beam attenuation by the substrate, and thus to improve the efficiency of the attack.

To avoid frauds, chips comprising an attack detection device coupled with a chip protection circuit have been provided. When an attack is detected, the protection circuit implements measures of protection, alienation, or destruction of the critical data. For example, it may be provided, when an attack is detected, to interrupt the power supply of the chip or to cause its resetting, to minimize the time during which the attacker can study the response of the chip to a disturbance.

Attack detection solutions may be logic. They for example comprise regularly introducing integrity tests into the calculations, to make sure that data have not been modified. Such solutions have the disadvantage of introducing additional calculation steps, thus increasing the chip response times. Further, integrity tests cannot detect all the disturbances caused by an attacker. The latter thus has room for maneuver to acquire critical data.

Other so-called physical attack detection solutions comprise sensors sensitive to temperature variations, to ultraviolet or X rays, enabling to detect suspicious activities. Like logic solutions, such solutions are not perfectly reliable. Indeed, before the attack detection, the attacker has room for maneuver to obtain critical data. Further, the implementation of such solutions is complex and increases the silicon surface area to form the chip.

BRIEF SUMMARY

One embodiment of the present disclosure is a structure for protecting an integrated circuit chip against attacks, which overcomes at least some of the disadvantages of existing solutions.

The present disclosure here provides a protection device enabling, instead of detecting that an attack is going on and of implementing measures of protection, alienation, or destruction of the confidential data, as usual protection devices do, preventing the attack from causing faulty operations in the chip circuits. The attacker will then no longer be able to inject faults into the chip circuits to deduce critical data therefrom.

One embodiment of the present disclosure is a protection device enabling to prevent the injection of faults by a laser beam.

One embodiment of the present disclosure is a protection device which does not increase the semiconductor surface area of the chip.

One embodiment of the present disclosure is a protection device further enabling to detect whether an attack is going on.

One embodiment provides an integrated circuit chip comprising: a plurality of parallel wells of alternated conductivity types formed in the upper portion of a semiconductor substrate of a first conductivity type; in each well of the first type, a plurality of MOS transistors having a channel of the second conductivity type, and in each well of the second type, a plurality of MOS transistors having a channel of the first type, transistors of neighboring wells being inverted-connected; and a device of protection against attacks, comprising: a layer of the second type extending under the plurality of wells, from the lower surface of said wells; and regions of lateral insulation between the wells, the lateral regions extending from the upper surface of the wells to the layer of the second type.

According to an embodiment, the lateral insulation regions entirely cross the layer of the second type and stop in the substrate.

According to an embodiment, the lateral insulation regions extend down to a depth greater than 2 μm.

According to an embodiment, the lateral insulation regions are trenches with insulated walls filled with a conductive material.

According to an embodiment, the conductive material is polysilicon.

According to an embodiment, the chip further comprises at least one detector associated with at least one of the lateral insulation regions, the detector being capable of detecting variations of the voltage of the conductive material of this region.

According to an embodiment, the detector is selected to detect variations of the voltage of the conductive material that may result from a bombarding of the chip by a laser beam.

According to an embodiment, the detector comprises a comparator having a first input terminal maintained, in operation, at a reference voltage, and having a second input terminal connected to the conductive material.

The foregoing and other features, and advantages will be discussed in detail in the following non-limiting description of specific embodiments in connection with the accompanying drawings.

DETAILED DESCRIPTION

Figure 1A:
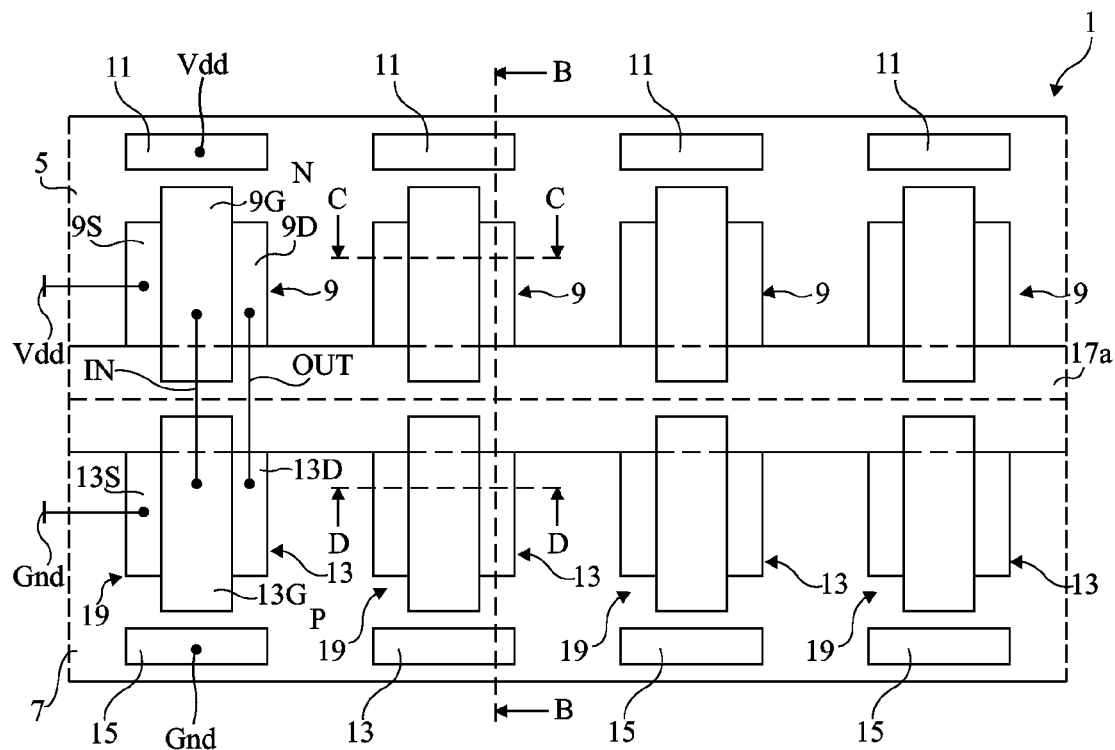
FIG. 1A is a top view schematically and partially showing an embodiment of an integrated circuit chip.

For clarity, the same elements have been designated with the same reference numerals in the different drawings and, further, as usual in the representation of integrated circuits, the various drawings are not to scale.

Figure 1B:
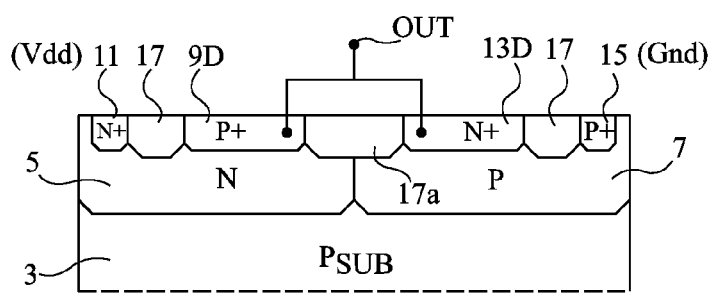
FIGS. 1B, 1C, and 1D are cross-section views along planes A-A, B-B, and C-C of FIG. 1A.
Figure 1C:
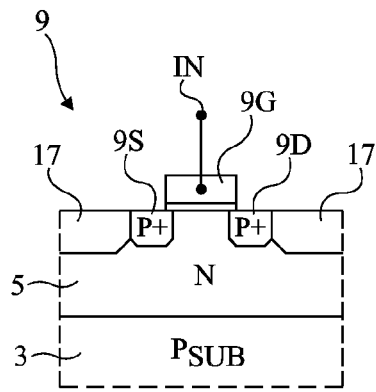
Figure 1D:
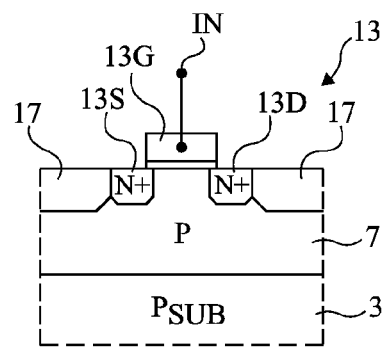

FIGS. 1A to 1D schematically and partially show an embodiment of an integrated circuit chip 1. FIG. 1A is a top view of chip 1, and FIGS. 1B, 1C, and 1D are cross-section views, respectively along planes A-A, B-B, and C-C, of FIG. 1A.

Chip 1 is formed from a lightly-doped P-type semiconductor substrate 3 ($P_{SUB}$), for example, a silicon substrate. Juxtaposed wells of alternated conductivity types are formed in the upper portion of substrate 3. In this example, only two wells 5 and 7, respectively of type N and of type P, having, in top view, the shape of juxtaposed parallel strips (in dotted lines in FIG. 1A), have been shown. In practice, chip 1 may comprise a large number of juxtaposed parallel wells of alternated conductivity types.

N-type well 5 comprises channels of a plurality of P-channel MOS transistors 9. Each transistor 9 comprises heavily-doped P-type source and drain regions 9S and 9D (P+), delimited by an insulated conductive gate 9G formed at the surface of well 5. Well 5 further comprises a plurality of heavily-doped N-type regions 11, forming biasing contact areas of the well. In this example, a contact area 11 is arranged in the vicinity of each transistor 9.

P-type well 7 comprises channels of a plurality of N-channel MOS transistors 13. Each transistor 13 comprises heavily-doped N-type source and drain regions 13S and 13D (N+), delimited by an insulated conductive gate 13G formed at the surface of well 7. Well 7 further comprises a plurality of heavily-doped P-type regions 15, forming biasing contact areas of the well. In this example, a contact area 15 is arranged in the vicinity of each transistor 13.

Insulating regions 17, 17a are formed in the upper portion of wells 5 and 7 to insulate the transistors from one another and from the contacting areas. In particular, an insulating region 17a having, in top view, the shape of a strip parallel to wells 5 and 7, extends with no discontinuity above the junction area between wells 5 and 7, thus insulating transistors 9 from transistors 13. Insulating regions 17 and 17a for example are trenches of a depth approximately ranging from 100 to 300 nm, filled with silicon oxide. Such trenches may be formed according to a method currently designated as STI (Shallow Trench Insulation) in the art.

In chip 1, each transistor 9 of well 5 is, in top view, arranged close to a transistor 13 of well 7. Neighboring transistors 9 and 13 are inverter-connected, that is, gate 9G of transistor 9 is connected to gate 13G of transistor 13, forming the input terminal of an inverter 19, and drain 9D of transistor 9 is connected to drain 13D of transistor 13, forming output terminal OUT of inverter 19. The gate-gate and drain-drain interconnects are formed by conductive tracks, not shown, for example, made of polysilicon or metal. As an example, in operation, source 9S of transistor 9 is at a high power supply voltage Vdd, source 13S of transistor 13 is at a low power supply voltage Gnd, bias contact 11 of well 5 is at high voltage Vdd, bias contact 15 of well 7 is at low voltage Gnd, and substrate 3 is at low voltage Gnd.

Inverters 19 form elementary cells of chip 1. They are interconnected by conductive tracks, not shown, to form blocks implementing functions of the chip.

The present inventors have studied the effects of a bombarding of chip 1 by a laser beam. They have observed the appearance of eddy currents due to the forming of electron-hole pairs at the level of the reverse-biased PN junctions, and especially at the level of the PN junctions between well 5 and well 7 and between substrate 3 and well 5. Such currents are capable of turning on parasitic NPN bipolar transistors formed by areas 11 and well 5 (N), well 7 (P), and drain regions 13D (N; PNP transistors formed contact areas 15 and well 7 (P), well 5 (N), and drain regions 9D (P; PNP transistors formed by drain regions 9D (P), well 5 (N), and substrate 3 (P); and PNP transistors formed by source regions 9S (P), well 5 (N), and substrate 3 (P). Bipolar transistors crossing source regions 9S and 13S of MOS transistors 9 and 13 may also be turned on. This may result in various operating anomalies, for example, logic faults, that is, the value of the signal on output terminal OUT of one or more of the inverters 19 is inverted with respect to the value which should normally be present on this terminal, given the signal applied on input terminal IN. Delay faults may also occur, that is, the switching of the output signal of one or more of the inverters 19 is delayed with respect to a switching in the absence of the laser beam.

Figure 2A:
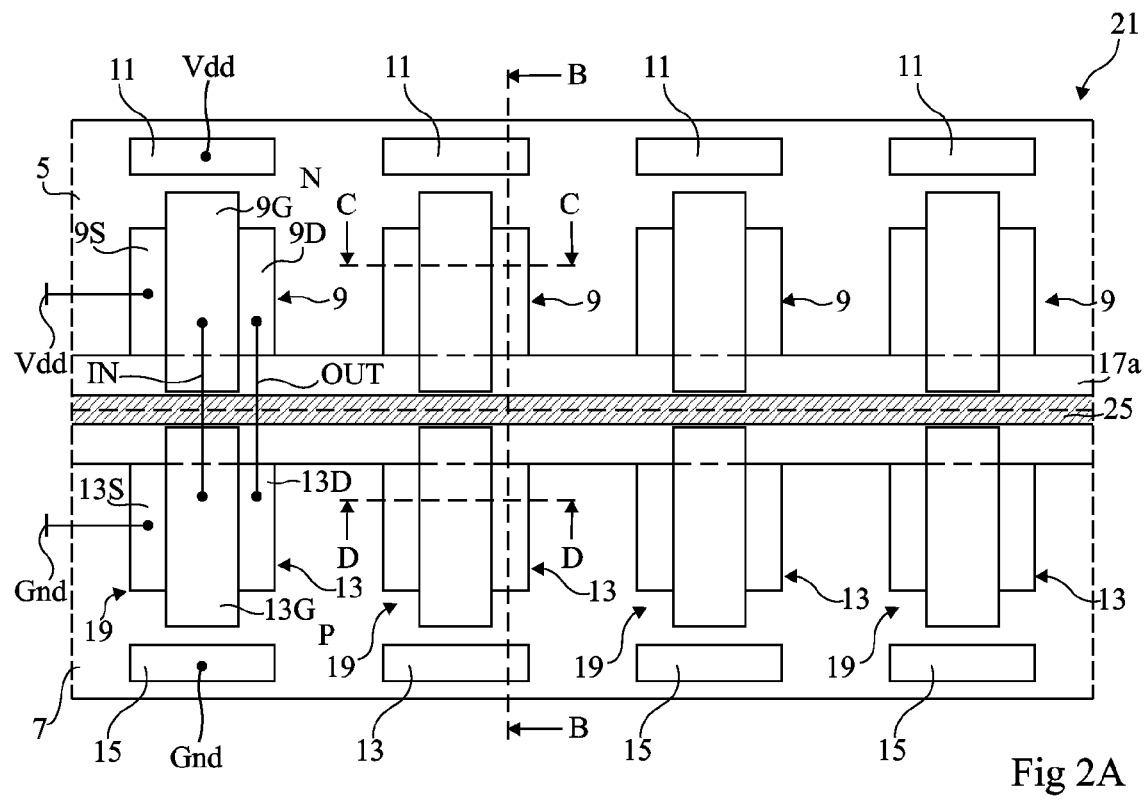
FIG. 2A is a top view schematically and partially showing an embodiment of an integrated circuit chip protected against attacks.
Figure 2B:
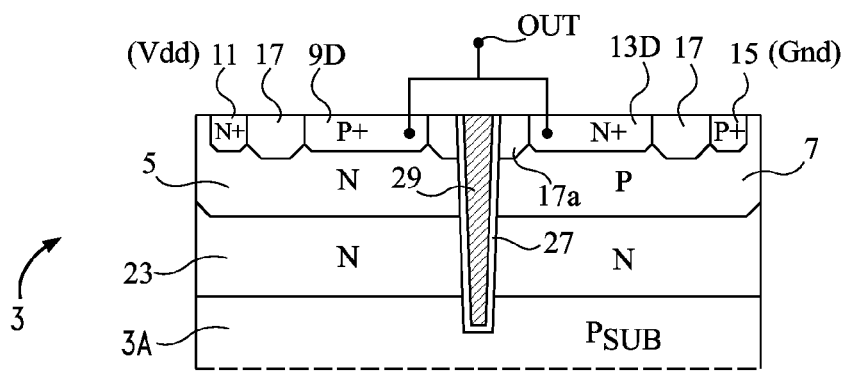
FIGS. 2B, 2C, and 2D are cross-section views along planes A-A, B-B, and C-C of FIG. 2A.
Figure 2C:
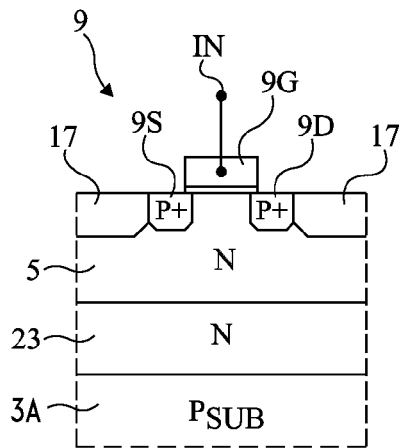
Figure 2D:
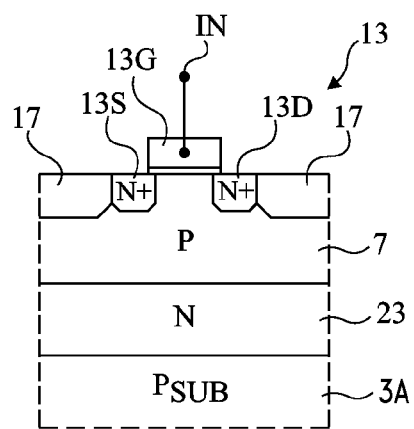

FIGS. 2A to 2D schematically and partially show an embodiment of an integrated circuit chip 21 protected against attacks. FIG. 2A is a top view of chip 21, and FIGS. 2B, 2C, and 2D are cross-section views, respectively along planes A-A, B-B, and C-C of FIG. 2A.

Like chip 1 of FIGS. 1A to 1D, chip 21 comprises parallel wells of alternated conductivity types, P-channel MOS transistors being formed in N-type wells and N-channel MOS transistors being formed in the P-type wells. Neighboring transistors of opposite types, formed in wells of opposite conductivity types, are assembled as inverters, forming elementary cells of chip 21. The elements common to chips 1 and 21 have been designated with the same reference numerals in the drawings and will not be described in detail again hereafter.

In chip 21, an N-type layer 23 extends under wells 5 and 7, at the interface between the wells 5 and 7 and a lower portion 3A of the substrate 3. As an example, the thickness of wells 5 and 7 ranges between 0.5 and 1.5 µm, and the thickness of layer 23 ranges between 1 and 2 µm. It should be noted that in practice, layer 23 and wells 5, of type N, may form a same N-type region.

Further, in chip 21, parallel wells 5 (of type N) and 7 (of type P) are not juxtaposed like in chip 1 of FIGS. 1A to 1D, but are separated by an insulating region 25 which extends from the upper surface of the wells to N layer 23. Region 25 forms a lateral insulation wall which behaves as an interface between well 5 and well 7. There thus do not exist, under inverters 19, lateral PN junctions between wells 5 and 7, as is the case in chip 1 of FIGS. 1A to 1D.

In the shown example, region 25 entirely crosses N-type layer 23, to emerge into the lower portion 3A of the substrate 3. Region 25 may be interrupted or opened in regions separating two inverters of the chip or in regions comprising no MOS transistors (no interrupt or opening is shown in FIGS. 2A to 2D). Such interrupts enable to guarantee the uniformity of the biasing of layer 23. In an alternative embodiment, region 25 may stop at an intermediate depth of layer 23, without extending into substrate 3.

In this example, insulating region 25 extends from the upper surface of surface insulating region 17a separating transistors 9 of well 5 from transistors 13 of well 7. In top view (FIG. 2A), insulating region 25 has the shape of a strip, possibly interrupted in certain regions of the chip, parallel to wells 5 and 7, having a smaller width than strip 17a, and substantially coinciding with the central portion of strip 17a. Thus, the provision of insulating region 25 does not increase the semiconductor surface area used to form the chip. In an alternative embodiment, surface insulation region 17a may be omitted.

Insulating region 25 for example is formed in a trench 25A having a depth approximately ranging from 2 to 4 µm and a width approximately ranging from 200 to 500 nm. The insulating region 25 includes a film 27 of an insulating material, such as silicon oxide, coating lateral walls and a bottom of the trench 25A and is filled with a conductive material 29 such as polysilicon. Such trenches may be formed according to a method currently designated as DTI (Deep Trench Insulation) in the art. In an alternative embodiment, trench 25 may be entirely filled with an insulating material such as silicon oxide. Any method capable of forming a sufficiently deep lateral insulation trench may be used.

In FIGS. 2A to 2D, only two parallel wells 5 and 7 have been shown. However, in practice, chip 21 may comprise a large number of parallel wells of alternated conductivity types, separated from one another by regions 25 having, in top view, the shape of strips (or of separate aligned strip sections) parallel to wells 5 and 7. Thus, in chip 21, transistors 9 and 13 forming a same inverter 19 are separated by an insulating wafer portion 25.

Trials performed by the present inventors have shown that the bombarding of a chip of the type described in relation with FIGS. 2A to 2D by a laser beam causes no operating anomalies. In the presence of the laser beam, a relatively high eddy current, due to the forming of electron-hole pairs at the level of the reverse-biased PN junction formed between the lower portion 3A of the substrate 3 and layer 23, effectively appears in substrate 3. However, such an eddy current has no incidence on the operation of the chip circuits. In particular, due to the presence of layer 23 and of insulating regions 25, no parasitic bipolar transistor is capable of being turned on under the effect of the laser beam.

In the case where lateral insulation region 25 comprises openings in certain chip regions, there remains, in these regions, lateral PN junctions between wells 5 and 7. However, such junctions have a small surface area and are sufficiently spaced apart from inverters 19 not to enable the injection of faults in circuits of the chip.

Thus, in chip 21, layer 23 and insulating regions 25 are elements of a protection device configured to protect the chip 21 against attacks by preventing consequences of an attack, that is, the injection of faults or operating anomalies into the chip circuits. This contrast with prior art devices that seek to detect an attack, and then to protect, alienate, or destroy the critical data of the chip.

An advantage of the provided protection device is that it enables to protect the chip, not only against laser attacks, but also against other types of attack, for example, attacks by fault injection by means of an electromagnetic field.

Another advantage of such a protection device is that it causes no increase of the silicon surface area used to form the chip.

Figure 3:
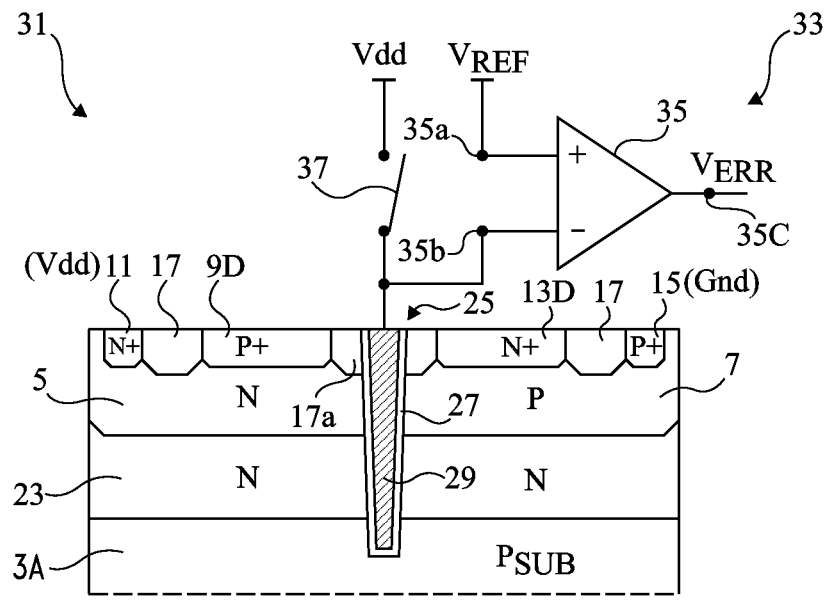
FIG. 3 is a simplified cross-section view of an embodiment of an integrated circuit chip protected against attacks, comprising an attack detection device.

FIG. 3 schematically and partially shows an alternative embodiment of an integrated circuit chip protected against attacks. Chip 31 comprises a protection device enabling not only to prevent the injection of faults, like in chip 21 described in relation with FIGS. 2A to 2D, but also to detect whether an attack is going on.

FIG. 3 is a cross-section view in the same plane as FIG. 2B. Chip 31 comprises the same elements as chip 21 of FIG. 2B, and further comprises an attack detection circuit 33. For clarity, circuit 33 has been shown in the form of an electric diagram connected to chip 31. In practice, circuit 33 may be integrated in the chip 31, or be a circuit external to chip 31.

To detect that an attack is going on, the detection circuit detects abnormal variations of voltage $V_{TR}$ of conductive material 29 filling trenches 25 arranged between neighboring parallel wells.

Conductive region 29 forms an electrode of a plurality of stray capacitors, especially between material 29 and well 5, between material 29 and well 7, between material 29 and layer 23, and between material 29 and substrate 3. There exist other stray capacitors in chip 31, for example at the level of the PN junction between substrate 3 and layer 23, and between well 7 and layer 23.

The chip bombarding by a laser beam causes a fast modification of the bias voltages of substrate 3, of layer 23, and/or of wells 5 and 7. The variations of the bias voltages are transmitted by the above-mentioned stray capacitor network, and cause a variation of the voltage of conductive region 29.

It is here provided to detect, using the circuit 33, variations of the voltage of conductive region 29 corresponding to a fraudulent attack. Once the attack has been detected, various measures of protection, alienation, or destruction of the confidential data may be implemented.

In this example, circuit 33 comprises a comparator 35 comprising input terminals 35a, 35b and an output terminal 35c. Input terminal 35b is electrically connected to conductive material 29 filling the trench with insulated walls 25. In operation, a reference voltage $V_{REF}$ is applied to input terminal 35a, and output terminal 35c provides a signal $V_{ERR}$ capable of switching between a high value and a low value according to whether voltage $V_{TR}$ of conductive material 29 is greater or smaller than voltage $V_{REF}$. Conductive material 29 filling trench 25 is further connected to a high voltage terminal $V_{DD}$ via a switch 37. In operation, switch 37, normally off, is periodically turned on, for example, for each rising or falling edge of the chip clock signal, to maintain conductive material 29 at a substantially constant floating voltage. As a variation, a bias voltage may be permanently applied to conductive material 29 (non-floating biasing).

Figure 4:
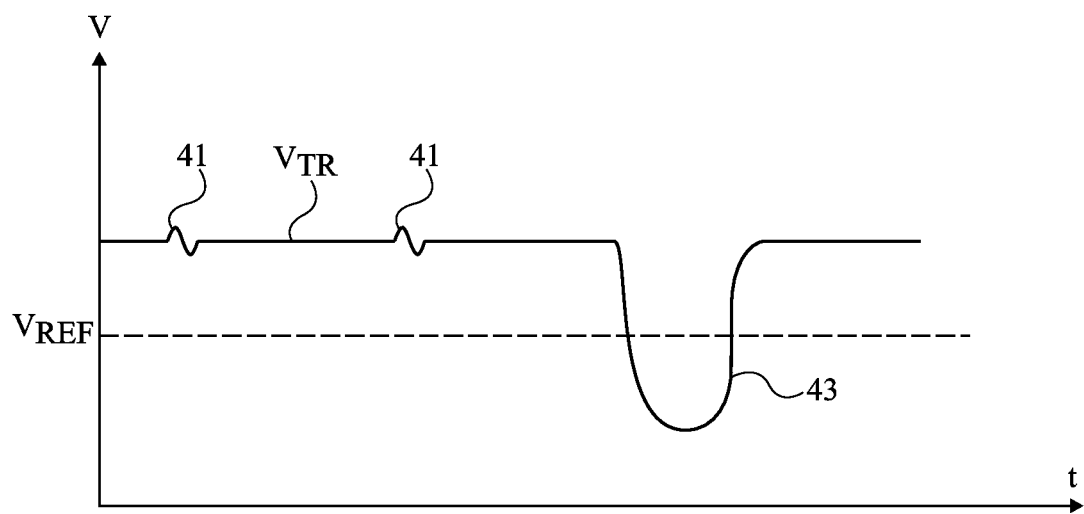
FIG. 4 is a timing diagram illustrating the variation of a signal of the attack detection device of the chip of FIG. 3.

FIG. 4 is a timing diagram illustrating the variation of voltage $V_{TR}$ of conductive region 29 during the chip operation. In normal operation, voltage $V_{TR}$ is maintained at a voltage greater than voltage $V_{REF}$ applied to input terminal 35a of comparator 35. As an example, voltage $V_{REF}$ is approximately 0.5 V, and voltage $V_{TR}$ is maintained at a substantially constant value on the order of 0.7 V.

Peaks 41 are observed on signal $V_{TR}$, which correspond to fast, low-amplitude variations of voltage $V_{TR}$. Peaks 41 are a consequence of normal transient phenomena occurring during the chip operation. As an example, the amplitude of peaks 41 is smaller than 0.1 V.

The timing diagram of FIG. 4 further shows a hollow 43 corresponding to an abrupt drop, of strong amplitude, of voltage $V_{TR}$. Such a voltage drop typically occurs in the presence of a fraudulent attack, for example, during the chip bombarding by a pulsed laser beam. More generally, in a fraudulent attack, a fast variation of voltage $V_{TR}$ occurs in conductive areas 29 of the attacked area. As an example, amplitude variations greater than 0.3 V can be typically observed in case of a laser attack on chips powered under 1.2 V. Voltage $V_{TR}$ then drops to a value smaller than voltage $V_{REF}$, thus resulting in a detection of the attack by circuit 33.

In practice, several detection circuits 33 may be provided on chip 31. One or several detection circuits 33 may for example be associated with each region 25 of separation of the chip wells. As an alternative, detection circuits 33 may be provided in the most critical chip areas only. It is also possible to provide, on a same chip 31, detection circuits 33 having different detection thresholds, for example, by applying different reference voltages $V_{REF}$ to input terminals 35a of the different comparators 35. It should be noted that the present disclosure is not limited to the use of above-described detection circuit 33. It will be within the abilities of those skilled in the art to provide any other circuit capable of detecting variations of the voltage of conductive regions 29 capable of corresponding to a fraudulent attack.

An advantage of the protection device described in relation with FIGS. 3 and 4 is that it provides an increased security, since it enables to detect that an attack is going on, in addition to preventing the injection of faults, like the protection device described in relation with FIGS. 2A to 2D does. This enables to provide additional protection measures such as resetting the chip in case of an attack.

Specific embodiments of the present disclosure have been described. Various alterations, modifications and improvements will readily occur to those skilled in the art.

In particular, embodiments of an integrated circuit chip protected against laser attacks has been described hereabove, the chip comprising parallel wells of alternated conductivity types formed in the upper portion of a semiconductor substrate, the wells being separated from one another by insulating regions 25. The present disclosure is not limited to the specific example described hereabove in which the wells have, in top view, the shape of parallel strips. "Parallel wells" is here more generally used to designate neighboring wells arranged so that a surface of a first well is in front of a surface of the second well and substantially parallel to this surface. In the provided structure, an insulating trench 25 forms an interface between said substantially parallel surfaces.

Further, examples of integrated circuit chips formed from a P-type substrate have been described hereabove. It will be within the abilities of those skilled in the art to adapt the provided protection device to a chip formed from an N-type substrate.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit chip comprising:
   first and second wells of first and second conductivity types, respectively, formed in an upper portion of a semiconductor substrate of the first conductivity type;
   a first plurality of MOS transistors having a channel of the second conductivity type formed in the first well;
   a second plurality of MOS transistors having a channel of the first conductivity type formed in the second well, the transistors of the second plurality being inverter-connected with the transistors of the first plurality, respectively; and
   a protection device configured to protect the integrated circuit chip against attacks, the protection device including:
      a protection layer of the second conductivity type extending under and contacting the first and second wells;
      a lateral insulation region between the wells, said lateral insulation region extending from an upper surface of the substrate to said protection layer, wherein said lateral insulation region includes a trench with insulated walls and filled with a conductive material; and
      a detector associated with said lateral insulation region, said detector being configured to detect variations of a voltage of the conductive material of said lateral insulation region.

2. The chip of claim 1, wherein the lateral insulation region is entirely across said protection layer and ends in a lower portion of the substrate.

3. The chip of claim 1, wherein the lateral insulation region extends down in the substrate to a depth greater than 2 μm.

4. The chip of claim 1, wherein the conductive material is polysilicon.

5. The chip of claim 1, wherein said detector is configured to detect variations of the voltage of the conductive material that may result from a bombarding of the chip by a laser beam.

6. The chip of claim 1, wherein said detector comprises a comparator having a first input terminal maintained, in operation, at a reference voltage, and having a second input terminal electrically coupled to said conductive material.

7. The chip of claim 6, wherein said detector comprises a switch electrically coupled between the conductive material and a voltage supply terminal, the switch being configured to intermittently electrically couple the conductive material to the voltage supply terminal.

8. The chip of claim 6, wherein the conductive material is electrically coupled to a voltage supply terminal.

9. A method of forming an integrated circuit chip, comprising:
   forming first and second wells of first and second conductivity types, respectively, formed in an upper portion of a semiconductor substrate of the first conductivity type;
   forming a first plurality of MOS transistors having a channel of the second conductivity type formed in the first well;
   forming a second plurality of MOS transistors having a channel of the first conductivity type formed in the second well, the transistors of the second plurality being inverter-connected with the transistors of the first plurality, respectively; and
   forming a protection device configured to protect the integrated circuit chip against attacks, forming the protection device including:
      forming a protection layer of the second type extending under and contacting the first and second wells;
      forming a lateral insulation region between the wells, said lateral insulation region extending from an upper surface of the substrate to said layer, wherein said lateral insulation region includes a trench with insulated walls and filled with a conductive material; and
      forming a detector associated with said lateral insulation region, said detector being configured to detect variations of a voltage of the conductive material of said lateral insulation region.

10. The method of claim 9, wherein forming the lateral insulation region includes forming the lateral insulation region entirely across said layer and into a lower portion of the substrate.

11. The method of claim 10, wherein forming the lateral insulation region includes forming the lateral insulation region down in the substrate to a depth greater than 2 µm.

12. The method of claim 9, wherein the conductive material is polysilicon.

13. The method of claim 9, wherein said detector is configured to detect variations of the voltage of the conductive material that may result from a bombarding of the chip by a laser beam.

14. The method of claim 9, wherein forming said detector comprises forming a comparator having a first input terminal maintained, in operation, at a reference voltage, and having a second input terminal electrically coupled to said conductive material.

15. The method of claim 14, wherein forming said detector comprises forming a switch electrically coupled between the conductive material and a voltage supply terminal, the switch being configured to intermittently electrically couple the conductive material to the voltage supply terminal.

16. The method of claim 14, wherein forming the detector includes electrically coupling the conductive material to a voltage supply terminal.

17. A method, comprising:
protecting an integrated circuit chip against attacks using a protection device, the integrated circuit chip including:
first and second wells of first and second conductivity types, respectively, formed in an upper portion of a semiconductor substrate having a first conductivity type;
a first plurality of MOS transistors having a channel of the second conductivity type formed in the first well;
a second plurality of MOS transistors having a channel of the first conductivity type formed in the second well, the transistors of the second plurality being inverter-connected with the transistors of the first plurality, respectively, wherein the protection device includes:
a protection layer of the second conductivity type extending under and contacting the first and second wells; and
a lateral insulation region between the wells, said lateral insulation region extending from an upper surface of the substrate to said layer and including a trench with insulated walls and filled with a conductive material; and
detecting variations of a voltage of the conductive material of the lateral insulation region in the chip using a detector associated with said lateral insulation region.

18. The method of claim 17, wherein the detecting includes detecting variations of the voltage of the conductive material resulting from a bombarding of the chip by a laser beam.

19. The method of claim 17, wherein the detecting includes detecting the variations of the voltage of the conductive material using a comparator having a first input terminal maintained at a reference voltage, and having a second input terminal electrically coupled to said conductive material.

20. The method of claim 19, wherein the detecting includes intermittently electrically coupling the conductive material to a voltage supply terminal by intermittently turning on a switch electrically coupled between the conductive material and the voltage supply terminal.

21. The method of claim 19, wherein the detecting includes biasing the conductive material to a bias voltage.

22. The method of claim 17, further comprising resetting the chip in response to detecting the variations of a voltage of the conductive material.

23. An integrated circuit chip comprising:
first and second wells of first and second conductivity types, respectively, formed in an upper portion of a semiconductor substrate of the first conductivity type; and
a protection device configured to protect the integrated circuit chip against attacks, the protection device including:
a protection layer of the second conductivity type extending under and contacting the first and second wells;
a lateral insulation region between the wells, said lateral insulation region extending from an upper surface of the substrate to said protection layer, wherein said lateral insulation region includes a trench with insulated walls and filled with a conductive material; and
a detector associated with said lateral insulation region, said detector being configured to detect variations of a voltage of the conductive material of said lateral insulation region.

24. The chip of claim 23, wherein the lateral insulation region is entirely across said protection layer and ends in a lower portion of the substrate.

25. The chip of claim 23, wherein said detector comprises a comparator having a first input terminal maintained, in operation, at a reference voltage, and having a second input terminal electrically coupled to said conductive material.

26. The chip of claim 23, wherein said detector comprises a switch electrically coupled between the conductive material and a voltage supply terminal, the switch being configured to intermittently electrically couple the conductive material to the voltage supply terminal.

* * * * *